SUPERCONDUCTIVE DEVICE

Filed June 8, 1962

Inventor:
Paul S. Swartz,
by Paul R. Webb, II
His Attorney.

United States Patent Office 3,158,793

Patented Nov. 24, 1964

3,158,793

SUPERCONDUCTIVE DEVICE

Paul S. Swartz, Schenectady, N.Y., assignor to General Electric Company, a corporation of New York Filed June 8, 1962, Ser. No. 201,184
10 Claims. (Cl. 317—158)

This invention relates to high field superconductive devices and more particularly to high field superconductive devices for compressing a magnetic field confined within a high field superconducting solenoid therein.

While the existence of superconductivity in many metals, metal alloys and metal compounds has been known for many years, the phenomenon has been more or less treated as a scientific curiosity until comparatively recent times. The awakened interest in superconductivity may be attributed, at least in part, to technological advances in the arts where their properties would be extremely advantageous in generators, direct current motors and low frequency transformers, and to advances in cryogenics which removed many of the economic and scientific problems involved in extremely low temperature operations.

As is well known, superconduction is a term describing the type of electrical current conduction existing in certain materials cooled below a critical temperature, $T_c$, where resistance to the flow of current is essentially nonexistent. A high field superconductive body is a body with a superconducting phase which remains superconducting in a magnetic field greater than the critical magnetic field of that phase in homogeneous, unstrained bulk form.

My copending patent application entitled "Superconductive Devices," which was filed on November 2, 1961, as Serial Number 149,592, is assigned to the same assignee as the present application. In this copending application, a high field superconductive device is disclosed and claimed which comprises a high field superconductive body having an aperture therethrough, means to maintain the temperature of the body below its critical temperature, a magnetic field generally parallel to the axis of the aperture confined substantially within the aperture of the body, and means for compressing the magnetic field.

The present application is directed to an improved high field superconductive device employing a high field superconductive solenoid.

It is an object of my invention to provide a high field superconductive device.

It is another object of my invention to provide a high field superconductive device with a high field superconductive solenoid.

It is a further object of my invention to provide a high field superconductive device for compressing a magnetic field confined within a solenoid therein, thereby increasing the magnetic field strength thereof.

In carrying out my invention in one form, a high field superconductive device comprises a high field superconductive solenoid having an aperture therethrough, a coating of non-superconducting material on the solenoid, means to produce a magnetic field generally parallel to the axis of the aperture within the aperture of said solenoid, means to maintain the temperature of the solenoid below its critical temperature, and means for compressing the magnetic field.

These and various other objects, features, and advantages of the invention will be better understood from the following description taken in connection with the accompanying drawing in which.

Figures 1, 2, 3, 4, 5, 6:
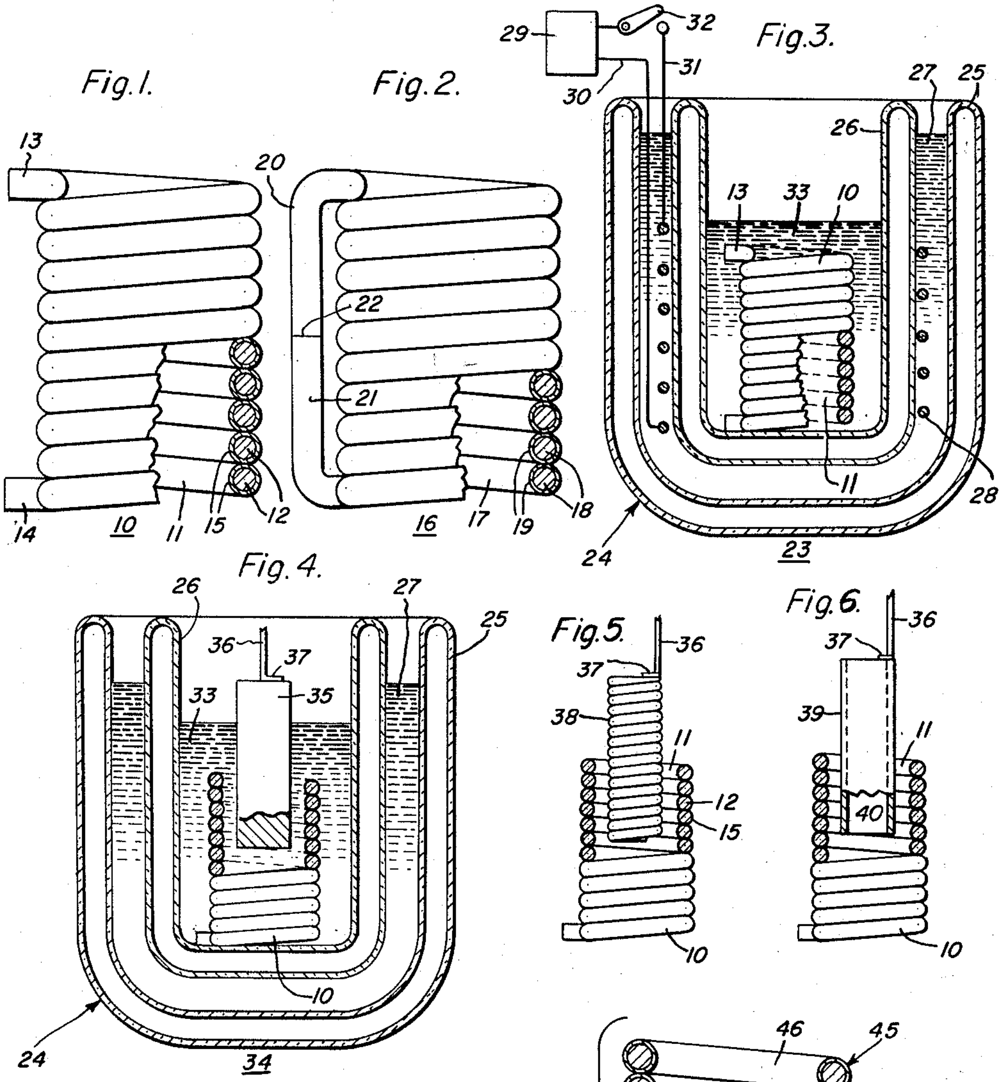
FIGURE 1 is a perspective view of a high field superconductive solenoid, partly in section.
FIGURE 2 is a perspective view of a shorted high field superconductive solenoid, partly in section.
FIGURE 3 is a sectional view of apparatus for providing a magnetic field within the aperture of the solenoid shown in FIGURE 1.
FIGURE 4 is a sectional view of a high field superconductive device embodying my invention.
FIGURE 5 is a sectional view of a modified high field superconductive device.
FIGURE 6 is a sectional view of a portion of a further modified high field superconductive device.

In FIGURE 1 of the drawing, a high field superconductive solenoid 10 is shown having a central aperture 11 therethrough. Solenoid 10 comprises a plurality of closely wound coils 12 of a superconducting material, alloy or compound. The free or unjoined ends of the coils are designated 13 and 14. A coating 15 of non-superconducting, electrically conducting material is provided on coils 12 prior to winding into solenoid 10. For example, a wire containing $Cb_3Sn$ is coated with a non-superconducting, electrically conducting coating of copper and coiled into a solenoid 10.

In FIGURE 2 of the drawing, a high field superconductive solenoid 16 is shown having a central aperture 17 therethrough. Solenoid 16 comprises a plurality of closely wound coils 18 of a superconducting material, alloy or compound. A coating 19 of non-superconducting, electrically conductive or electrically insulating material is provided on coils 18 prior to winding into solenoid 16. The coils ends 20 and 21 are shorted by joining them together at 22 by any suitable means. A coiled wire containing $Cb_3Sn$ with a coating of copper can also be employed for solenoid 16.

A high field superconductive device is constructed of a high field superconductive solenoid having an aperture therethrough, a coating of non-superconducting material on the solenoid, means to maintain the temperature of the solenoid below its critical temperature, a magnetic field generally parallel to the axis of the aperture confined substantially within the aperture of the solenoid, and means for compressing the magnetic field.

The high field superconductive solenoid could consist of a superconducting material, alloy or compound in the form of wire, coil or ribbon. Such a solenoid includes a plurality of closely wound coils having free or unjoined ends. A coating of non-superconducting, electrically conducting material is provided on the coils prior to winding into the solenoid to delay flux leakage from the magnetic field compressed within the solenoid aperture. Such a solenoid can also have its ends joined or shorted by connecting these ends together. A coating of non-superconducting, electrically conducting or electrically insulating material is provided on the coils prior to winding into the solenoid for the same purpose.

A superconducting solenoid with a non-superconducting coating, rod or tube is maintained below its critical temperature and inserted in the first solenoid aperture to compress the magnetic field. The employment of the coated solenoid produces a slow decay of the superconducting current with a time constant of approximately $L/R_{coil}$ where L is the total inductance of the coil and $R_{coil}$ is its resistance at superconducting temperatures arising from the resistance of the non-superconducting coating on the coil windings. This decay time can be made long by using a large number of windings and employing a coating of low resistivity on the windings. The increase in the coil windings increases the inductance, L, of the coil and the coating of low resistivity decreases the non-superconducting resistance $R_{coil}$ of the coil. Since the magnetic flux can escape or decay only with a decay time of approximately $L/R$, it reduces greatly the problem of flux jumping which has been previously observed in devices which do not employ a high field superconducting solenoid.

The solenoid can be formed from windings of any high field superconducting material which can be fabricated into ribbon, coil or wire. The non-superconducting coating on the solenoid windings can be electrically conductive if the winding ends are unjoined or either electrically conductive or insulating if the winding ends are joined. For example, suitable electrically conductive coatings can be formed from copper or silver while suitable insulating coatings include ceramic materials and rubber.

In FIGURE 3, apparatus is shown generally at 23 for producing a magnetic field within aperture 11 of solenoid 10 disclosed in FIGURE 1 which comprises an insulated container 24 having an outer insulated vessel 25 and an inner insulated vessel 26 separated by liquid nitrogen 27. For example, solenoid 10 is positioned within inner insulated vessel 26 and on the bottom thereof. A solenoid 28, which is positioned in liquid nitrogen 27, surrounds the exterior wall of solenoid 10 and is connected to a power source 29 by means of leads 30 and 31. A switch 32 is provided in lead 31 between solenoid 28 and power source 29 to energize and de-energize solenoid 28 to provide a magnetic field generally parallel to the axis of aperture 11 or at a slight angle thereto and within solenoid 10 and aperture 11. Liquid helium 33 is poured into vessel 26 to immerse solenoid 10 to cool the solenoid below its critical temperature, $T_c$. If desired, solenoid 28 can be made of a high field superconductive material and positioned directly in liquid helium 33 to surround solenoid 10.

In the operation of the apparatus shown in FIGURE 3, superconductive solenoid 10 having an aperture 11 therethrough is positioned within inner insulated vessel 26 of insulated container 24. Solenoid 28 is positioned in liquid nitrogen 27 in vessel 25 to surround solenoid 10. Switch 32 is closed to energize solenoid 28 to produce a magnetic field generally parallel to the axis of aperture 11 and within both solenoid 10 and its aperture 11. Liquid helium 33 is poured into vessel 26 to contact solenoid 10 to cool the solenoid from above to below its critical temperature, $T_c$.

As solenoid 10 is cooled below its critical temperature, the solenoid becomes superconducting. When solenoid 10 has become completely superconductive, the magnetic field which is parallel to the axis of the aperture is confined substantially therein. Switch 32 is then opened to de-energize solenoid 28 whereupon the applied magnetic field is terminated. The confined magnetic field within aperture 11 is enhanced in magnitude and remains therein.

In FIGURE 4, a high field superconductive device 34 is shown which comprises an insulated container 24 having an outer insulated vessel 25 and an inner insulated vessel 26 separated by liquid nitrogen 27. For example, a high field superconductive solenoid 10 of the type shown in FIGURE 1 of the drawing is positioned within inner insulated vessel 26 and on the bottom thereof. This solenoid has a magnetic field confined within its aperture 11 and generally parallel to the axis of the aperture. Such a magnetic field is created in the apparatus shown in FIGURE 3. Liquid helium 33 surrounds the exterior wall of solenoid 10 to maintain the temperature of the solenoid below its critical temperature.

A high field superconductive member in the form of a rod 35 is maintained below its critical temperature. Rod 35 which has a diameter less than the diameter of aperture 11 of solenoid 10 is inserted into aperture 11 by means of rod 36 and bracket 37 attached to rod 36. Such insertion can be manual or automatic. When member 35 is inserted into aperture 11, the confined magnetic field is compressed within aperture 11 to increase the magnitude of the field strength between rod 36 and the interior wall of solenoid 10 thereby producing a compressed field, $H_{com}$. Since both rod 36 and the solenoid are superconducting, they act to exclude the magnetic flux therefrom.

In FIGURE 5, a modified high field superconductive device is shown which includes the structure of device 34 shown in FIGURE 4 with the exception of rod 35. A bracket 37 carrying a rod 36 is attached to a high field superconductive solenoid 38 coated with a non-superconducting, electrically conductive material. Solenoid 38, which is maintained below its critical temperature, is inserted into aperture 11 to compress the magnetic field within aperture 11.

In FIGURE 6, a portion of a further modified high field superconductive device is disclosed which includes a solenoid 10 with an aperture 11 therein confining a magnetic field. A high field superconductive member 39 is provided in the form of a tube having a central aperture 40 therein. A magnetic field generally parallel to the axis of aperture 40 is confined within aperture 40 which field is in a reverse direction to the magnetic field in aperture 11. Member 39, which is maintained below its critical temperature, is inserted into aperture 11 of solenoid 10 to compress the confined magnetic field in aperture 11 and the returning flux lines of member 39 between the outer wall of member 39 and the wall of aperture 11 to increase the magnitude of the magnetic field strength.

Figure 7:
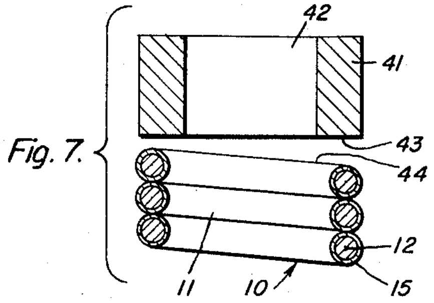
FIGURE 7 is a sectional view of a portion of a further modified high field superconductive device.

In FIGURE 7, a portion of a further modified high field superconductive device is disclosed which includes a solenoid 10 with an aperture 11 therein confining a magnetic field. A high field superconductive member 41 is in the form of a ring with an aperture 42 therein confining a magnetic field generally parallel to the axis of the aperture and in reverse direction to the confined field in aperture 11 of solenoid 10. Member 41 is maintained below its critical temperature. Either member 41 or solenoid 10 is moved toward the other along a common axis, or member 41 and solenoid 10 are moved toward each other to compress a magnetic field between their respective end walls 43 and 44.

Figure 8:
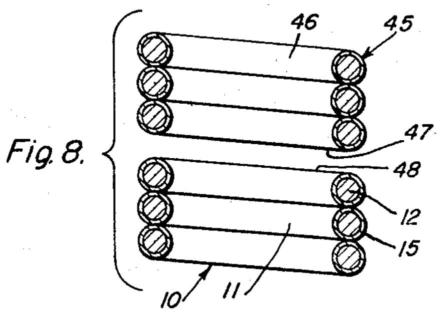
FIGURE 8 is a sectional view of a further modified high field superconductive device.

In FIGURE 8, a portion of a further modified high field superconductive device is disclosed which includes a solenoid 10 with an aperture 11 therein confining a magnetic field. A high field superconductive solenoid 45 is shown with an aperture 46 therein confining a magnetic field generally parallel to the axis of the aperture and in reverse direction to the confined field in aperture 11 of solenoid 10. Solenoid 45 is also coated with a non-superconducting material. Solenoid 45 is maintained below its critical temperature. Either solenoid is moved toward the other solenoid along a common axis, or the solenoids are moved toward each other to compress a magnetic field between their respective end walls 47 and 48. In FIGURES 5, 6, 7 and 8, the additional structure of the high field superconductive device has been omitted since such structure is identical with the structure shown in FIGURE 4.

While other modifications of this invention and variations thereof which may be employed within the scope of the invention have not been described, the invention is intended to include such that may be embraced within the following claims.

What I claim as new and desire to secure by Letters Patent of the United States is:

1. A high field superconductive device comprising a high field superconductive solenoid having an aperture therethrough, a coating of non-superconducting material on said solenoid, means to produce a magnetic field generally parallel to the axis of said aperture within the aperture of said solenoid, means to maintain the temperature of said solenoid below its critical temperature, and means for compressing said magnetic field.

2. A high field superconductive device comprising a shorted high field superconductive solenoid having an aperture therethrough, a coating of non-superconducting material on said solenoid, means to produce a magnetic field generally parallel to the axis of said aperture within the aperture of said solenoid, means to maintain the temperature of said solenoid below its critical temperature, and means for compressing said magnetic field.

3. A high field superconductive device comprising a high field superconductive solenoid with unjoined ends having an aperture therethrough, a coating of non-superconducting, electrically conducting material on said solenoid, means to produce a magnetic field generally parallel to the axis of said aperture within the aperture of said solenoid, means to maintain the temperature of said solenoid below its critical temperature, and means for compressing said magnetic field.

4. A high field superconductive device comprising an insulated container, a high field superconductive solenoid positioned in said container, a coating of non-superconducting material on said solenoid, said solenoid having an aperture therethrough, means to produce a magnetic field generally parallel to the axis of said aperture within the aperture of said solenoid, a coolant within said container contacting the exterior wall of said solenoid to maintain the temperature of said solenoid below its critical temperature, and means for compressing said magnetic field.

5. A high field superconductive device comprising a high field superconductive solenoid having an aperture therethrough, a coating of non-superconducting material on said solenoid, means to produce a magnetic field generally parallel to the axis of said aperture within the aperture of said solenoid, means to maintain the temperature of said solenoid below its critical temperature, and a high field superconductive member maintained at a temperature below its critical temperature for compressing said magnetic field.

6. A high field superconductive device comprising a high field superconductive solenoid having an aperture therethrough, a coating of non-superconducting material on said solenoid, means to produce a magnetic field generally parallel to the axis of said aperture within the aperture of said solenoid, means to maintain the temperature of said solenoid below its critical temperature, a high field superconductive body having an aperture therethrough maintained at a temperature below its critical temperature, means to produce a magnetic field generally parallel to the axis of the aperture of said body within said aperture and in a reverse direction to the magnetic field in said solenoid, said body adapted to be inserted into the aperture of said solenoid to compress the magnetic field in the aperture of said solenoid and the returning magnetic flux lines from the magnetic field of said body.

7. A high field superconductive device comprising a high field superconductive solenoid having an aperture therethrough, a coating of non-conducting material on said solenoid, means to produce a magnetic field generally parallel to the axis of said aperture within the aperture of said solenoid, means to maintain the temperature of said solenoid below its critical temperature, a second high field superconductive solenoid having an aperture therethrough maintained at a temperature below its critical temperature, a coating of non-superconducting material on said second solenoid, means to produce a magnetic field generally parallel to the axis of the aperture of said second solenoid substantially within said aperture and in a reverse direction to the magnetic field in said first solenoid, said second solenoid adapted to be inserted into the aperture of said first solenoid to compress the magnetic field in the aperture of first said solenoid and the returning magnetic flux lines from the magnetic field of said second solenoid.

8. A high field superconductive device comprising a high field superconductive solenoid having an aperture therethrough, a coating of non-superconducting material on said solenoid, means to produce a magnetic field generally parallel to the axis of said aperture within the aperture of said solenoid, means to maintain the temperature of said solenoid below its critical temperature, a high field superconductive body having an aperture therethrough maintained at a temperature below its critical temperature, means to produce a magnetic field generally parallel to the axis of the aperture of said body substantially within said aperture and in a reverse direction to the magnetic field in said solenoid, and said body moveable toward said solenoid along a common axis to compress a magnetic field therebetween.

9. A high field superconductive device comprising a high field superconductive solenoid having an aperture therethrough, a coating of non-superconducting material on said solenoid, means to produce a magnetic field generally parallel to the axis of said aperture within the aperture of said solenoid, means to maintain the temperature of said solenoid below its critical temperature, a second high field superconductive solenoid having an aperture therethrough maintained at a temperature below its critical temperature, a coating of non-superconducting material on said second solenoid, means to produce a magnetic field generally parallel to the axis of the aperture of said second solenoid substantially within said aperture and in a reverse direction to the magnetic field in said first solenoid, and at least one of said solenoids moveable toward the other of said solenoids along a common axis to compress a magnetic field therebetween.

10. A high field superconductive device comprising a high field superconductive solenoid having an aperture therethrough, a coating of non-superconducting material on said solenoid, means to produce a magnetic field generally parallel to the axis of said aperture within the aperture of said solenoid, means to maintain the temperature of said solenoid below its critical temperature, a high field superconductive body having an aperture therethrough maintained at a temperature below its critical temperature, means to produce a magnetic field generally parallel to the axis of the aperture of said body substantially within said aperture and in a reverse direction to the magnetic field of said solenoid, and said solenoid movable toward said body along the common axis to compress a magnetic field therebetween.

References Cited by the Examiner

UNITED STATES PATENTS 3,109,963 11/63 Geballe -------------- 317—158

JOHN F. BURNS, *Primary Examiner.*